(12) United States Patent
Onogawa

(10) Patent No.: US 6,645,553 B1
(45) Date of Patent: Nov. 11, 2003

(54) RECORDING MATERIAL MATTING PROCESS

(75) Inventor: Toru Onogawa, Shizuoka (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 10/328,141

(22) Filed: Dec. 26, 2002

Related U.S. Application Data

(62) Division of application No. 09/348,841, filed on Jul. 8, 1999, now Pat. No. 6,517,928.

(30) Foreign Application Priority Data

Jul. 14, 1998 (JP) ............................................. 10-198668

(51) Int. Cl.[7] ............................................. B41M 3/12
(52) U.S. Cl. ....................... 427/146; 428/195; 428/32.1
(58) Field of Search ................................. 428/195, 32.1; 427/146

(56) References Cited

U.S. PATENT DOCUMENTS 4,216,289 A  *  8/1980  Oda et al. ................... 430/302
5,508,064 A  *  4/1996  Naruse ........................ 427/421

FOREIGN PATENT DOCUMENTS

| EP | 0 762 211 | 3/1997 |
| EP | 0 883 028 | 12/1998 |
| JP | 57-034558 | 2/1982 |
| JP | 57-205188 | 12/1982 |
| JP | 1-224076 | 9/1989 |
| JP | 5-057076 | 3/1993 |
| JP | 6-202339 | 7/1994 |

* cited by examiner

Primary Examiner—Bruce H. Hess
Assistant Examiner—Michael E. Grendzynski
(74) Attorney, Agent, or Firm—Burns, Doane, Swecker & Mathis, LLP

(57) ABSTRACT

A recording material having sufficient height and equivalent dimensions of mats formed thereon and a matting process capable of forming these improved mats. A matting process including the step of forming mats on the recording face laminated on the substrate of a recording media with a screen by screen printing and a recording material having the thus formed mats formed on the recording face thereof.

9 Claims, 1 Drawing Sheet

RECORDING MATERIAL MATTING PROCESS

This application is a divisional of application Ser. No. 09/348,841, filed on Jul. 8, 1999, now U.S. Pat. No. 6,517,928.

FIELD OF THE INVENTION

The present invention relates to a recording material and its matting process.

BACKGROUND ART

There are a variety of technologies concerning processes for preparing recording materials. One of these concerns a process for matting the front or back surface of a recording material such as photographic photosensitive material and the like. This matting technology has been aimed at the prevention of electrostatic charging or mutual adhesion of, for example, photographic photosensitive materials, or otherwise, the improvement of vacuum adhesion properties.

Prior matting technologies are disclosed in, for example, Japanese Patent Kokai Publications JP-A-1-224076/1989 and JP-A-6-202339/1994.

SUMMARY OF THE DISCLOSURE

However, the following problems have been encountered in the course of the investigations toward the present invention. Namely, the matting process disclosed in the Japanese Patent Kokai Publication JP-A-1-224076 essentially includes the step of matting a recording material by ink-jet printing, and thereby has the following problems.

Highly viscous liquid for matting of not less than several tens cP (liquid composition of a matting material dispersed in a dispersion medium) cannot be used in this process since this process employs ink-jet printing. The projection height of the resultant mats will become low since the liquid for matting has a low viscosity and its droplets adhered on the surface of a recording material continuously spread and make their diameter enlarged until they are dried. A concentration of solid contained in the liquid for matting cannot be increased satisfactorily in this process since this process requires a liquid of low viscosity for matting. Accordingly, it is difficult to obtain sufficient height of the resultant mats after drying.

On the other hand, the matting process disclosed in the Japanese Patent Kokai Publication JP-A-2-202339 essentially includes the step of making fine droplets of liquid for matting by using a spin atomizer, and thereby has the following problems.

It is difficult to obtain sufficient height of mats in this process similarly to the above case of ink-jet printing, since the viscosity of applicable liquid for matting is about 200 cP at most, although the liquid may have a higher viscosity than that usable in the above ink-jet printing process. Further, droplets produced from the liquid in spin atomizing have distribution in their sizes. Consequently, undesired sizes of mats are inevitably formed on a recording material. These undesired sizes of mats possibly cause deterioration of the recording material's properties.

Accordingly, it is an object of the present invention to solve the problems that the above described prior arts have, i.e., to provide a recording material having sufficient height and even size of mats formed thereon and a matting process capable of using sufficiently high viscous matting dispersion and thereby preparing these improved mats.

According to the present invention, the above object is attained by a recording material including screen-printed mats formed on the surface thereof and a matting process including the step of forming mats on a recording material by screen printing. Particularly, there are provided a recording material according to claim 1 and a matting process according to an independent claim 11.

Further aspects and features of the invention are set forth in the dependent claims which are incorporated herein by reference.

In a screen printing process, a highly viscous liquid for matting (termed as "matting liquid", too) which has a sufficiently high solid concentration can be used as a printing liquid. Thereby, highly projected mats can be formed on a recording material by applying a screen printing process. The screen printing process is a printing process employing a screen which may have a pattern, preferably, of evenly sized through-holes, and accordingly, dot-formed mats of the same size can be formed thereby.

In the following, preferred embodiments of the invention will be described for better illustration of the invention, but not for the limitative purpose.

PREFERRED EMBODIMENTS OF THE INVENTION

Screen Printing Process

Viscosity of the liquid for matting used in a screen printing process may range from 1 to 100,000 cP, preferably, 100 to 20,000 cP, more preferably 1,000 to 10,000 cp.

Thickness of the screen for printing may range from 0.03 to 0.25 mm, preferably, 0.05 to 0.20 mm, more preferably, 0.05 to 0.15 mm.

According to the process of the present invention, any mat layer composed of dots having any desired size(s) and height(s) and having any desired pitch(es) between adjacent two of the dots, especially, the mat layer composed of dots having sizes of not more than 0.2 mm and heights ranging from 0.5 to 20 μm can be formed.

Any dot shape of the mats can be formed depending on the design of the screen pattern which may have through-holes of squarish, elliptic or any other form. Any line form(pattern) of the mats can also be formed by the design of the screen pattern which has slits in stead of the through-holes.

One of the preferred embodiment matting processes of the present invention for matting a recording material is as follows.

After preparing a screen capable of forming desirable mats, screen printing is applied on the surface of a recording material by using it. For forming mats, a squeegee is usually used other than a recording material, a liquid for matting which contains a matting material dispersed or dissolved therein, and the screen prepared. Screen printing is carried out as follows.

The screen used has a dot pattern of through-holes each of which has approximately the same size as that of mats to be formed for obtaining a desirable size of mats. This screen is placed closely near a recording material followed by supplying a sufficient amount of the liquid for matting on the screen (on the side to the recording material). The liquid for matting is squeezed out from the through-holes of the screen and transferred to the recording material by sliding the squeegee over the screen so as to scrape the supplied liquid. Then, the matting material contained in the liquid is fixed on the recording material by drying or the like. The drying temperature is set appropriately depending on the kind of the liquid used for matting.

Figure 1:
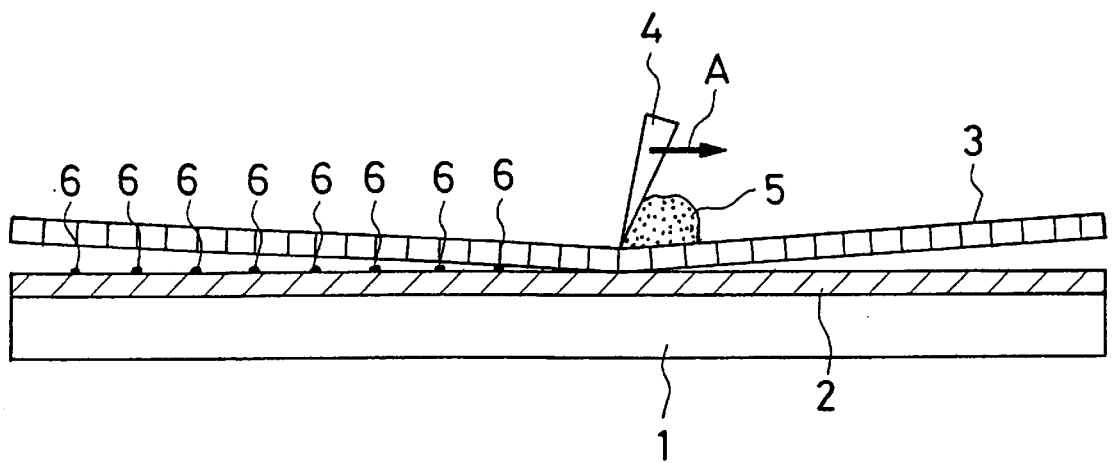
FIG. 1 is an explanatory cross sectional view showing one embodiment process of the present invention for forming mats by using a planar screen.

In case of forming mats by using a planar screen as illustrated in FIG. 1, the following procedure will be carried out.

The planar screen 3 used has a dot pattern of through-holes each of which has approximately the same size as that of mats to be formed for obtaining a desirable size of mats. This screen 3 is brought into close contact with a recording face 2 laminated on the surface of a substrate 1 of a recording material followed by supplying a sufficient amount of liquid 5 for matting on the upper side (being in no contact with the recording face 2) of the screen 3. The liquid 5 for matting is squeezed out from the through-holes (not shown in the figure) of the screen 3 and mats 6 (wet mats) are transferred thereby onto the recording face 2 by sliding the squeegee 4 on the screen along the direction designated by the arrow "A" so as to scrape the supplied liquid 5. Then, mats are fixed on the recording face 2 by drying the transferred wet mats 6.

Figure 2:
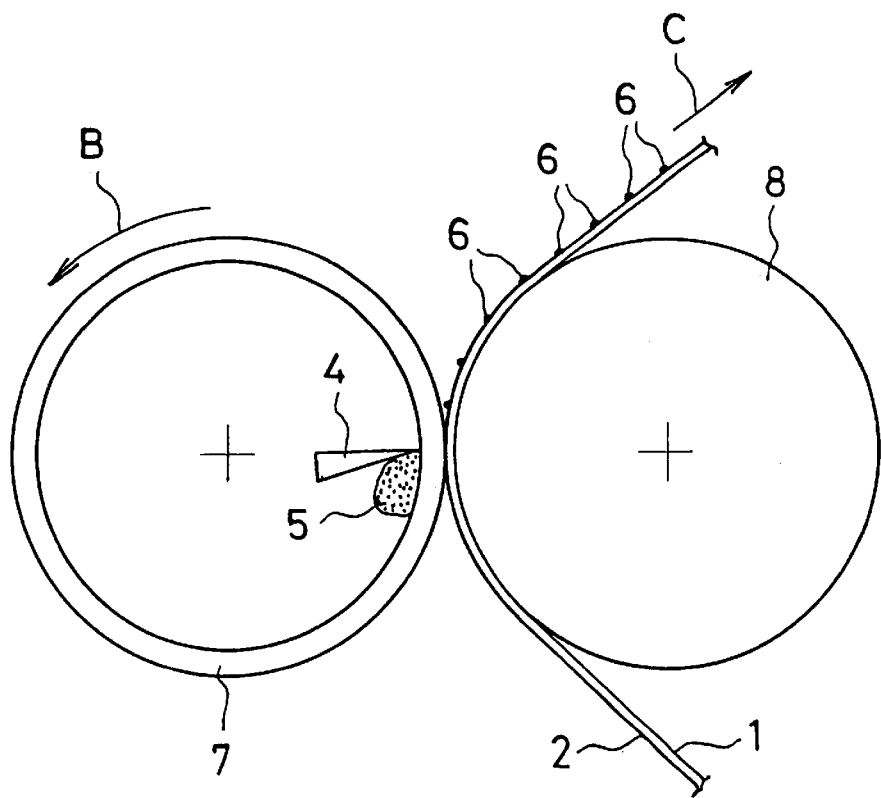
FIG. 2 is an explanatory cross sectional view showing another embodiment process of the present invention for continuously forming mats on a recording material of long length by rotary screen printing.

In case of forming mats by using a rotary tubular(annular) screen as shown in FIG. 2, the following procedure will be performed.

The rotary screen 7 used has a dot pattern of through-holes each of which has approximately the same size as that of mats to be formed for obtaining a desirable size of mats. The rotary screen 7 is rotated in the direction designated by the arrow "B". A recording material (substrate 1 having recording face 2 laminated thereon) of a long web is running continuously along the direction designated by the arrow "C" while being sandwiched between the rotary screen 7 and cylindrical roll 8.

Keeping the rotary screen 7 in close contact with the recording face 2 laminated on the surface of the substrate 1, a sufficient amount of liquid 5 for matting, which is desired to be applied, is supplied to the inside (being on the side in no contact with the recording face 2) of the rotary screen. The liquid 5 for matting is squeezed out from the through-holes (not shown in the figure) of the screen 7 and mats 6 (wet mats) are transferred onto the recording face 2 side by sliding the squeegee 4 on the screen so as to scrape the supplied liquid. Then, mats are fixed on the recording face 2 by drying the transferred wet mats 6.

Liquid for Matting

As a liquid for matting, which is to be printed (or coated) on a recording material by screen printing, liquid can be used which includes a matting material (which may be dissolved or not) dispersed in a dispersion medium for forming mats on the recording material.

As the matting material, which is a material for forming mats on a recording material, one or more of resins are preferably used. More preferably, here is used a radio-curable matting material which can be fixed on a recording material by irradiation of rays.

On condition that the recording material is photographic photosensitive material, laser-recording material or the like, resins (matting materials) contained in liquid for matting include, for example, those disclosed in the specification of Japanese Patent Application No. 55-109984/1980 (=JP Patent Kokai Publication JP-A-57-34558), i.e. copolymer of acrylate and acrylic or methacrylic acid; copolymer of styrene, acrylate, and acrylic acid or methacrylic acid; copolymer of acrylate, styrene, acrylonitrile and methacrylic, maleic or itaconic acid; vinyl polymer such as polyvinyl alcohol, polyvinyl acetate, polyvinyl pyrrolidone etc.

A preferable liquid for matting is an aqueous liquid prepared by selecting appropriately one or more of these resins and dissolving or dispersing the selected resin(s) according to a conventional method. Solvent for the liquid may contain an organic solvent besides water.

The liquid for matting may include fillers such as water-soluble material other than the above water-soluble resin, fine inorganic powder, powder of polymer and the like provided that they never adversely affect the photosensitive layer of a recording material and/or adhered droplets of the liquid for matting.

An exemplary process for preparing the liquid for matting includes the steps of emulsifying monomers, i.e., raw materials of, e.g., the above copolymer into water with a surfactant, and polymerizing these emulsified monomers by using a polymerization initiator such as potassium persulfate or the like to prepare an aqueous dispersion of the emulsion polymerization products similarly to the usual process for synthesizing a latex. Also, an aqueous solution of the copolymer can be obtained by replacing a part of acrylic acid, methacrylic acid, maleic acid, itaconic acid or the like by sodium, potassium or ammonium salt thereof. These aqueous dispersion or solution may be used as the liquid for matting.

Recording Material

A recording material essentially consists of a substrate and a recording layer formed thereon. The recording layer includes a photographic photosensitive layer, magnetic recording layer and the like various layers. These layers are selected depending on the use of a recording material and the like.

For example, recording materials having a photographic photosensitive layer include a photographic photosensitive material for general use, micro-photographic photosensitive material, radiosensitive material, photographic photosensitive material for printing, photographic photosensitive material for scientific use, photographic paper, thermo-developable photosensitive material and the like. Other recording material includes a laser-recording material which is sensitive to laser beams, magnetic recording tape and film having a magnetic recording layer, and the like. A photosensitive planographic printing plate is preferable as a recording medium to which the process of the present invention is applied.

The substrate of a recording material of the present invention usually has a dimensionally stable surface. Sheet or plate is a preferable form of the substrate in case of photosensitive materials with respect to convenience for use; and tape or sheet, in case of magnetic recording material and the like. As such, a preferable form of the substrate is selected appropriately from the practical aspect in putting the recording material into practice, or otherwise, depending on devices to which the recording material is to be applied.

Materials of the substrate include laminated paper of hot-melt plastic such as polyethylene, polypropylene, polystyrene and the like; metallic plate of aluminum, a variety kinds of aluminum alloy, zinc, iron, copper and the like; film of plastic such as cellulose diacetate, cellulose acetate, cellulose acetate butyrate, cellulose propionate, cellulose triacetate, cellulose nitrate, polyethylene terephthalate, polypropylene, polycarbonate, polyvinyl acetal and the like; paper or plastic film applied with a metal (layer) such as the above described one deposited thereon by lamination or vacuum (vapor) deposition; and the like. Preferable material of the substrate is also selected appropriately depending on the use of a recording material and the like.

There have been known a variety of technologies concerning recording layers of a recording material known to the skilled person in the art which include not only a photosensitive layer (recording layer) of a photographic photosensitive material but also those of laser-recording material, magnetic recording and the like. For example, a known photosensitive layer of a photographic photosensitive material includes silver halide-gelatin emulsion photosensitive layer, diazonium resin photosensitive layer and photopolymer photosensitive layer and the like. In the present invention, it is possible to utilize these known technologies concerning constitution, material, production, processing of these recording material as well as recording process, use of the recording materials and the like.

EXAMPLE

Example 1

One side of aluminum plate of 0.24 mm in thickness was ground and dressed by using a nylon brush and an aqueous suspension of 400 mesh pumice powder and then washed well with water. Thereafter, this plate was immersed into an aqueous solution of tribasic sodium phosphate (5% by weight) at 70 for 2 minutes followed by washing with water and drying to prepare a substrate. A photosensitive liquid was prepared by dissolving 1 part by weight of polyhydroxyphenyl naphthoquinone-1,2-diazido-5-sulphonate, which is a condensation polymerization product of acetone and pyrogallol as shown in JP-B-43-28403 and 2 parts by weight of novolak phenol-formaldehyde resin into 20 parts by weight of methyl ethyl ketone and then coated on the dressed side of the substrate. The coated substrate was dried to prepare a photosensitive planographic printing plate.

On the other hand, a liquid of 5,000 cP in viscosity for matting was prepared by adjusting the solid content of an aqueous solution containing a copolymer of methyl methacrylate/ethyl acrylate/sodium acrylate (=68:20:12 by weight in terms of charge weight) to 30% by weight.

As a screen for printing, there was used a metal mask of 0.1 mm in thickness having through-holes of 0.05 mm in diameter arranged at lateral and longitudinal pitches of 0.5 mm.

Screen printing was applied on the photosensitive layer of the photosensitive planographic printing plate by using the planar screen and the liquid for matting. Consequently, mats having diameters of 0.10 to 0.12 mm were formed on the photosensitive layer. The heights of the mats were about 10 $\mu$m, that is, approximately constant.

Example 2

A cylindrical screen having the same pattern of the above planate screen was prepared. Rotary screen printing was applied on the photosensitive layer of the photosensitive planographic printing plate of a long web by using the cylindrical screen and the liquid formatting. Consequently, mats having diameters of 0.12 to 0.15 mm were formed on the photosensitive layer. The heights of the mats were about 10 $\mu$m, that is, approximately constant.

The meritorious effects of the present invention will be summarized as follows.

According to the present invention, mats are formed on a recording material by screen printing. Accordingly, highly viscous liquid can be used for matting. Consequently, the solid content of the liquid for matting can be sufficiently increased. As a result, mats formed by drying the liquid for matting can have sufficient heights and the same dimensions (the same size and height) with each other.

It should be noted that other objects of the present invention will become apparent in the entire disclosure and that modifications may be done without departing the gist and scope of the present invention as disclosed herein and appended herewith.

Also it should be noted that any combination of the disclosed and/or claimed elements, matters and/or items may fall under the modifications aforementioned.

What is claimed is:

1. A matting process of a recording material comprising the steps of:

preparing a matting liquid, preparing a screen having a pattern of through-holes corresponding to mats, and forming mats on the surface of a recording material by screen printing said matting liquid.

2. The matting process as defined in claim 1, wherein said recording material is a photosensitive planographic printing plate.

3. The matting process as defined in claim 1, wherein said recording material is in the form of a long web and said screen comprises a rotary screen.

4. The matting process as defined in claim 1, wherein said matting liquid is a viscous liquid.

5. The matting process as defined in claim 1, wherein said matting liquid has a viscosity of 1 to 100,0000 cP.

6. The matting process as defined in claim 1, wherein said matting liquid has a viscosity of at least 1000 cP.

7. The matting process as defined in claim 1, wherein said screen has a thickness of 0.03 to 0.25 mm.

8. The matting process as defined in claim 1, wherein said screen has a thickness of at least 0.05 mm.

9. The matting process as defined in claim 1, wherein said through-holes have a diameter of 0.2 mm or less.

* * * * *